United States Patent [19]

Chappelow et al.

[11] Patent Number: 4,757,207
[45] Date of Patent: Jul. 12, 1988

[54] MEASUREMENT OF REGISTRATION OF OVERLAID TEST PATTERNS BY THE USE OF REFLECTED LIGHT

[75] Inventors: Ronald E. Chappelow, Essex Junction, Vt.; Lawrence P. Hayes, deceased, late of Binghamton, N.Y., by Ellen J. Hayes, administratrix

[73] Assignee: International Business Machines Corporation, Armonk, N.Y.

[21] Appl. No.: 21,276

[22] Filed: Mar. 3, 1987

[51] Int. Cl.$^4$ .......................................... G01N 21/01
[52] U.S. Cl. ................................ 250/491.1; 356/400; 356/401
[58] Field of Search ................. 250/491.1; 356/400, 356/401

[56] References Cited

U.S. PATENT DOCUMENTS

| | | | |
|---|---|---|---|
| 3,488,106 | 1/1970 | Lohmann | 235/183 |
| 3,531,196 | 9/1970 | Kosanke et al. | 95/4.5 |
| 3,660,157 | 5/1972 | Villers et al. | 117/212 |
| 3,867,038 | 2/1975 | Westell | 356/172 |
| 4,009,453 | 2/1982 | Mahlein | 331/94.5 C |
| 4,200,395 | 4/1980 | Smith et al. | 356/400 |
| 4,211,489 | 7/1980 | Kleinknecht et al. | 356/400 |
| 4,311,389 | 1/1982 | Fay et al. | 356/354 |
| 4,327,292 | 4/1982 | Wang et al. | 250/491 |
| 4,664,524 | 5/1987 | Hattori et al. | 356/401 |

OTHER PUBLICATIONS

IBM Technical Disclosure Bulletins, vol. 16, No. 1, Jun. 1973, p. 16
IBM Technical Disclosure Bulletins, vol. 18, No. 4, Sept. 1976, p. 1224.
IBM Technical Disclosure Bulletins, vol. 19, No. 4, Sept. 1976, p. 1459.
IBM Technical Disclosure Bulletins, vol. 22, No. 3, Aug. 1979, pp. 1054–1055; vol. 22, No. 10, Mar. 1980, pp. 4440–4441; vol. 22, No. 12, May 1980, p. 5475.
IBM Technical Disclosure Bulletins, vol. 23, No. 4, Sept. 1980, p. 1366; vol. 23, No. 7A, Dec, 1980, pp. 2996–2998.
IBM Technical Disclosure Bulletins, vol. 18, No. 4, Sept. 1975, pp. 1110–1112.

Primary Examiner—Carolyn E. Fields
Assistant Examiner—John A. Miller
Attorney, Agent, or Firm—Sughrue, Mion, Zinn, Macpeak and Seas

[57] ABSTRACT

Two identical test patterns are overlaid upon each other on a planar substrate of semiconductor material A. Each pattern consists of a plurality of spaced parallel lines. The lines are arranged in two sets of horizontal lines and two sets of vertical lines. The line/space periodicity is known. The lines of the two test patterns are made of two different materials, B and C, respectively. Thus, the target pattern formed by the two test patterns and the substrate has four reflecting regions defined by the different layers in each region: A, AB, AC and ABC. Adjacent the overlaid patterns are four macro-zones each containing a different one of the four layers, A, AB, AC and ABC. Each macro-zone is illuminated by a broad spectrum light, such as that from an incandescent lamp, and the reflected light intensity from each macro-zone is measured. Then, the reflected light intensities from the two sets of horizontal lines are separately measured, as are the reflected intensities from the two sets of vertical lines. One then can calculate both the horizontal and vertical overlay error from the known periodicity and the measured light intensities. Instead of reflected intensities, one can use transmitted intensities. Depending upon the materials used, the illumination can be provided by sources of other electromagnetic radiations, such as infrared, ultraviolet and x-ray.

13 Claims, 7 Drawing Sheets

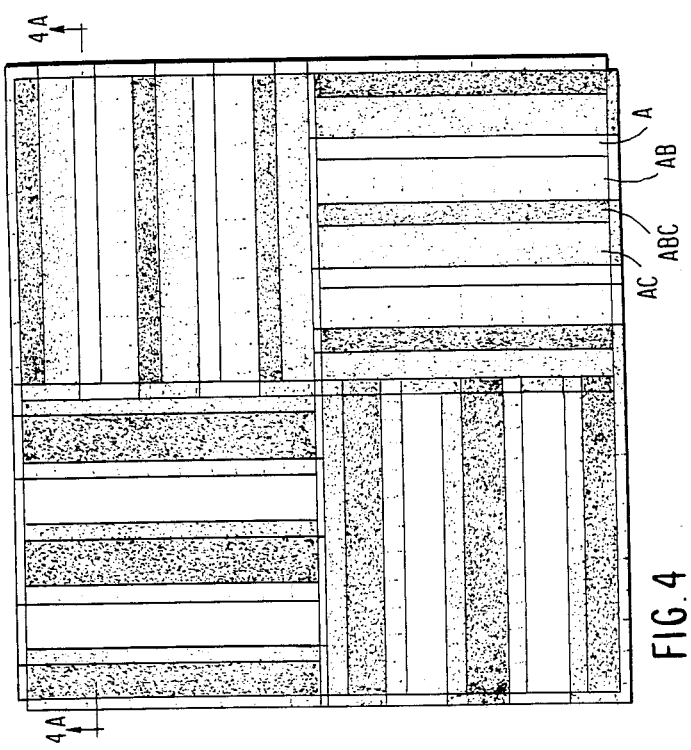
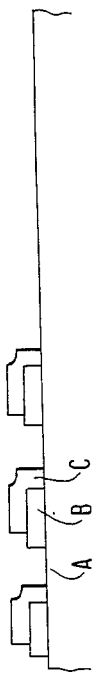
FIG. 4
FIG. 4A
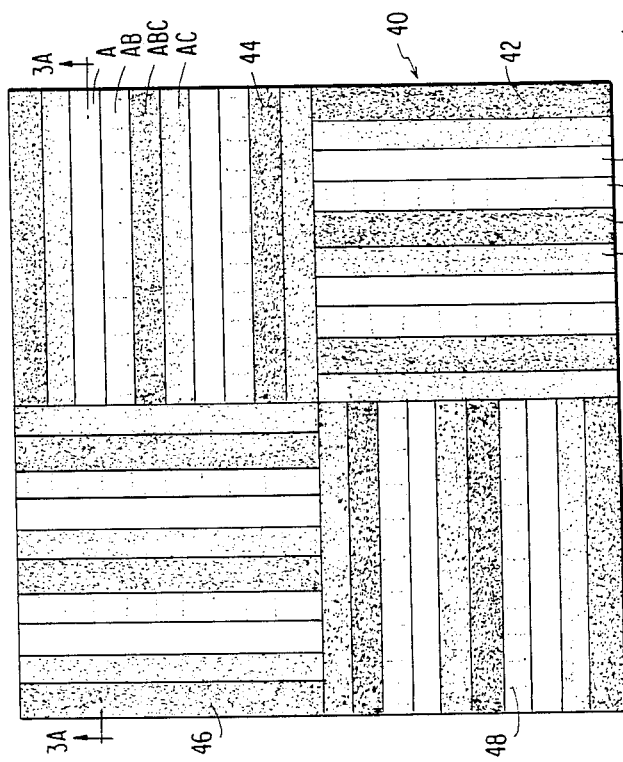
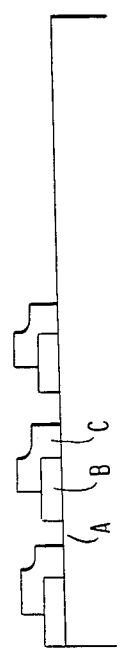
FIG. 3
FIG. 3A

FIG. 11
PATTERN A
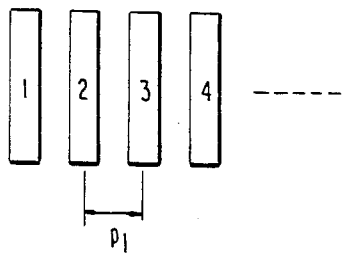
FIG. 12
PATTERN B
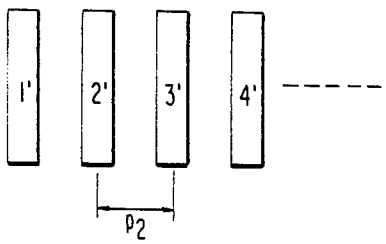
FIG. 13
PATTERN A
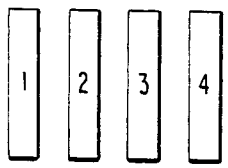
PATTERN B
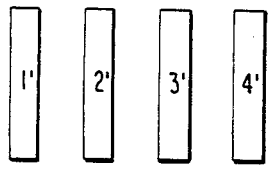

MEASUREMENT OF REGISTRATION OF OVERLAID TEST PATTERNS BY THE USE OF REFLECTED LIGHT

BACKGROUND OF THE INVENTION

1. Field of the Invention

The invention relates generally to the field of measuring the registration of overlaid patterns by the use of electromagnetic radiation and, more particularly, to using the radiation reflected from different portions of overlaid patterns to measure any error in the registration of the overlaid patterns.

2. Description of the Prior Art

There have been proposed in the prior art many techniques for optically measuring the registration or alignment of two planar surfaces, such as a photomask and a semiconductor wafer.

For example, Kleinknecht et al in U.S. Pat. No. 4,211,489 have disclosed an automatic photomask alignment system in which a monochromatic light beam is directed through a key on a photomask onto a diffraction grating on a semiconductor substrate to produce a pattern of light spots whose intensities at various locations are determined by the relative alignment of the photomask and substrate.

Fay et al in U.S. Pat. No. 4,311,389 have disclosed a method of aligning a mask plane with a pattern plane. Linear Fresnel zones are inscribed on the mask plane, and a reflecting grating is inscribed on the pattern plane. A monochromatic light beam is directed through the Fresnel zones onto the reflecting grating such that the intensity of the reflected light is an indication of the alignment of the two planes.

Wang et al in U.S. Pat. No. 4,327,292 have disclosed an alignment process in which a focused laser beam is directed onto alignment marks on first and second surfaces to be aligned. The reflected beams are detected to form respective first and second serial signals which are compared in phase with a reference signal to produce respective error signals indicative of the misalignment of the two surfaces.

Westell in U.S. Pat. No. 3,867,038 has disclosed a system for optically aligning two objects by matching images of fixed reticles on the objects to a rotating reticle by convolution of the fixed reticle images with the rotating reticle.

Other registration and alignment measuring techniques are disclosed in U.S. Pat. Nos. 3,488,106; 3,531,196; 3,660,157 and 4,009,453; and in the following IBM Technical Disclosure Bulletins; Vol. 16, No. 1, June 1973, page 16; Vol. 18, No. 4, September 1975, pages 1110–1112; Vol. 19, No. 4, September 1976, page 1224; Vol. 19, No. 4, September 1976, page 1459; Vol. 22, No. 3, August 1979, pages 1054–1055; Vol. 22, No. 10, March 1980, pages 4440–4441; Vol. 22, No. 12, May 1980, page 5475; Vol. 23, No. 4, September 1980, page 1366; and Vol. 23, No. 7A, December 1980, pages 2996–2998.

SUMMARY OF THE INVENTION

Two patterns are superimposed or overlaid upon each other on a substrate. The overlaid patterns, together with a substrate, form a target pattern consisting of four distinct regions whose respective reflectivities are determined by the combination of layers formed by the substrate and the overlaid patterns and by the respective materials in the substrate and patterns. The four regions or combinations of layers from which radiation may be reflected are: the substrate alone; the substrate overlaid by the first pattern; the substrate overlaid by the second pattern; and the substrate overlaid by both the first and second patterns.

Each pattern consists of a geometrical configuration formed of a material unique to that pattern. The average reflectivity for perfect registration of two test patterns can be mathematically defined in terms of the reflectivities of the four individual regions. The average reflectivity of the two patterns when they are not in perfect registration can also be mathematically determined. Thus, by measuring the average reflectivity of the overlaid patterns, one can readily deduce the degree to which they are in registration, thereby providing a quantitative measure for pattern overlay.

In accordance with the prefered embodiment of the invention, four reference zones or macro-zones are formed adjacent each test pattern, with each macro-zone consisting of only the layer or layers of a different one of the four regions. Each macro-zone is exposed to a broad spectrum light source, such as an incandescent lamp, or to another source of electromagnetic radiation, such as infrared, ultraviolet or x-ray, and the intensity of the radiation reflected from each of the four macro-zones is measured. Then, the intensity of the radiation reflected from the target pattern is also measured. One then can easily calculate the amount of overlay or registration error in both the vertical and horizontal directions.

BRIEF DESCRIPTION OF THE DRAWINGS

FIG. 3 illustrates a target pattern formed by two overlaid patterns in perfect registration.

FIG. 3A is a cross-sectional view taken along line 3A—3A in FIG. 3. FIG. 4 illustrates a target pattern formed by two overlaid patterns which are not in perfect registration.

FIG. 4A is a cross-sectional view taken along line 4A—4A in FIG. 4.

FIGS. 11-13 illustrate the vernier method of overlay measurement.

DETAILED DESCRIPTION OF THE PREFERRED EMBODIMENT

Figure 1:
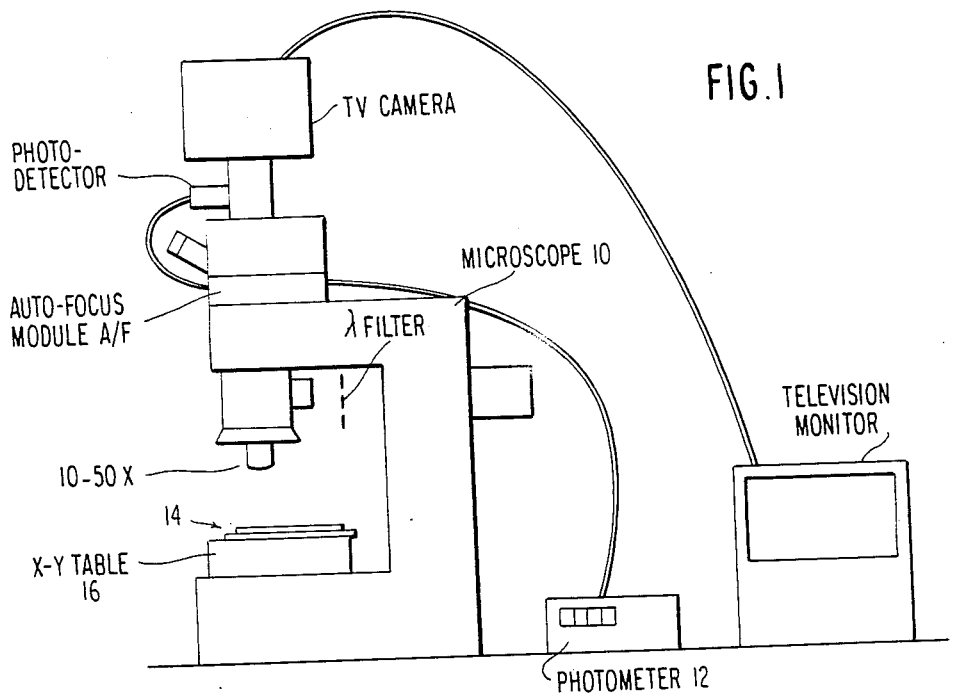
FIG. 1 is a schematic block diagram of a basic apparatus for carrying out the method of this invention.
Figure 2:
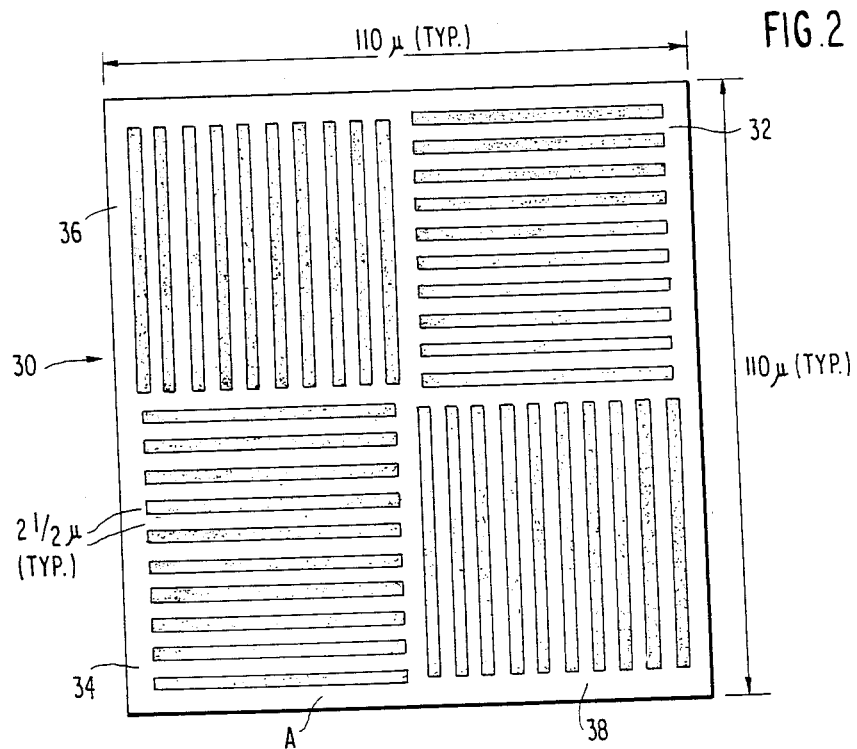
FIG. 2 illustrates one of the two identical patterns used in a preferred embodiment of the invention.

FIG. 1 shows the elements of a basic apparatus for practicing the method of this invention. The apparatus includes a microscope 10 of standard configuration, a photometer 12 for detecting light intensity, and a sample 14 mounted on a table 16 capable of translational movement in the x and y directions. Upon this sample are imprinted two overlaid identical patterns which are nominally in perfect registration. FIG. 2 illustrates one test pattern 30 and FIGS. 3 and 3A illustrate a target pattern 40 formed by two of the test patterns in perfect registration.

In the preferred embodiment, each test pattern 30 consists of two horizontal phase grid structures 32 and 34 and two vertical phase grid structures 36 and 38. Each phase grid structure consists of spaced lines of the same material, and the periodicity of the lines is the same for all the structures. The lines of a test pattern are all made from the same material. For example, assuming the patterns are formed on a silicon substrate A, the lines of the upper test pattern may be made of photoresist material, and the lines of the lower test pattern of $SiO_2$. The materials of the patterns and substrate are thin enough so that they both partially transmit and also partially reflect light incident thereupon from a broad spectrum light source, such as incandescent lamp, or, depending upon the materials used, from a source of infrared, ultraviolet or x-ray radiation.

FIGS. 3 and 3A illustrate the condition in which two test patterns 30 are overlaid upon each other on a silicon substrate A. The $SiO_2$ lines of the lower test pattern are designated by the letter B, and the photoresist lines of the upper test pattern are designated by the letter C. For the perfect registration condition illustrated in FIG. 3, the target pattern 40 consists of four distinct regions consisting of different layers from which the incident light is reflected. If the substrate is designated as A, and the first and second layers as B and C, then the four reflecting regions are A, AB, AC, and ABC. Each region has a unique broad band reflectivity, depending on the particular combination of layers in the region. More specifically, the average reflectivity in each of the four quadrants 42, 44, 46 and 48 of the perfectly registered target pattern 40 of FIG. 3 is given by $$R_1 = \tfrac{1}{4}R_A + \tfrac{1}{4}R_{AB} + \tfrac{1}{4}R_{AC} + \tfrac{1}{4}R_{ABC} \quad (1)$$

However, if the two test patterns are not in perfect registration, the average reflectivity will change; more specifically, the coefficients, $\tfrac{1}{4}$, given above for perfect registration will vary depending upon the proportion of exposure of each of the particular regions A, AB, AC, and ABC. FIG. 4 illustrates an example of imperfect registration wherein, as an example, the two patterns are shifted both horizontally and vertically a distance of $\tfrac{1}{2}$ a linewidth relative to each other. In this example, then, the average observed reflectivity will be $$R_2 = \tfrac{1}{8}R_A + \tfrac{3}{8}R_{AB} + \tfrac{1}{8}R_{AC} + \tfrac{3}{8}R_{ABC} \quad (2)$$

In general, $R_2$ is different from $R_1$, and the difference is proportional to the degree of misregistration illustrated in FIG. 4. Thus, it has been mathematically shown that, by measuring the average reflectivity of the overlaid test patterns, one can readily determine the degree to which the patterns are in registration, thereby providing a quantitative measure for pattern overlay or registration. One constraint is that the reflectivity of region A does not equal that of region ABC, and that the reflectivity of region AB does not equal that of region AC.

Figure 5:
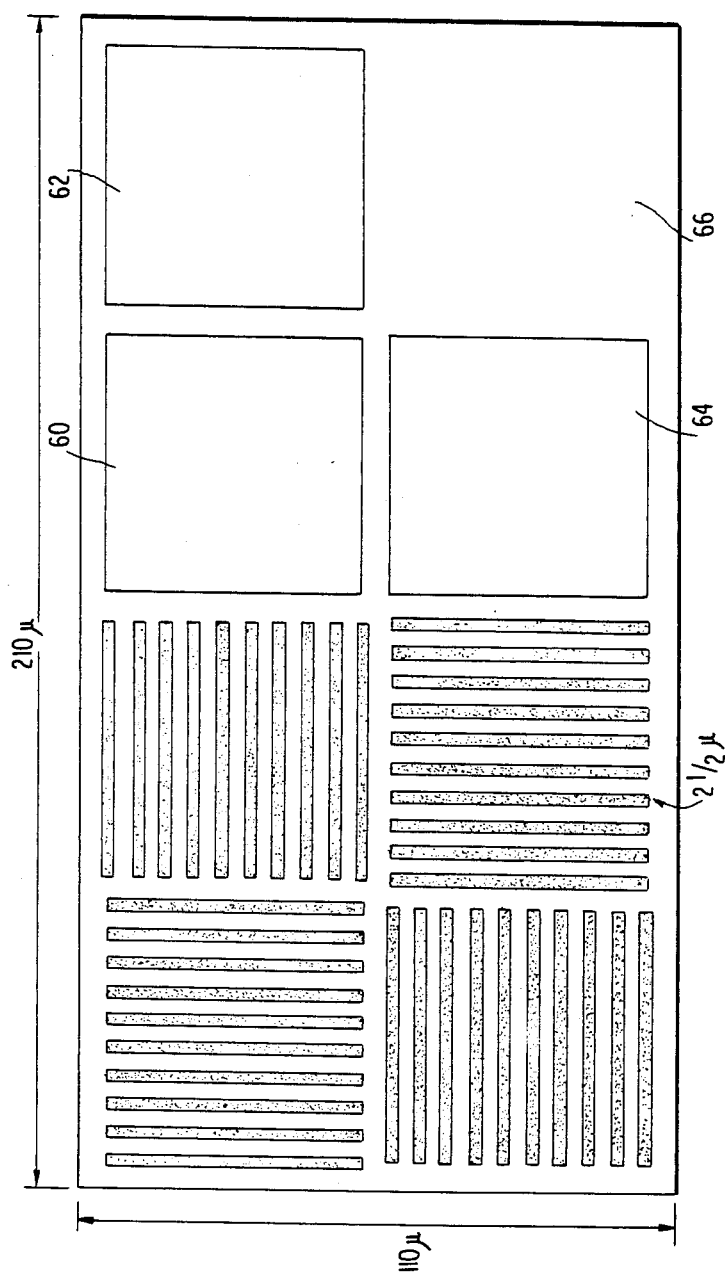
FIG. 5 illustrates a complete test pattern including the four macro-zones.
Figure 6:
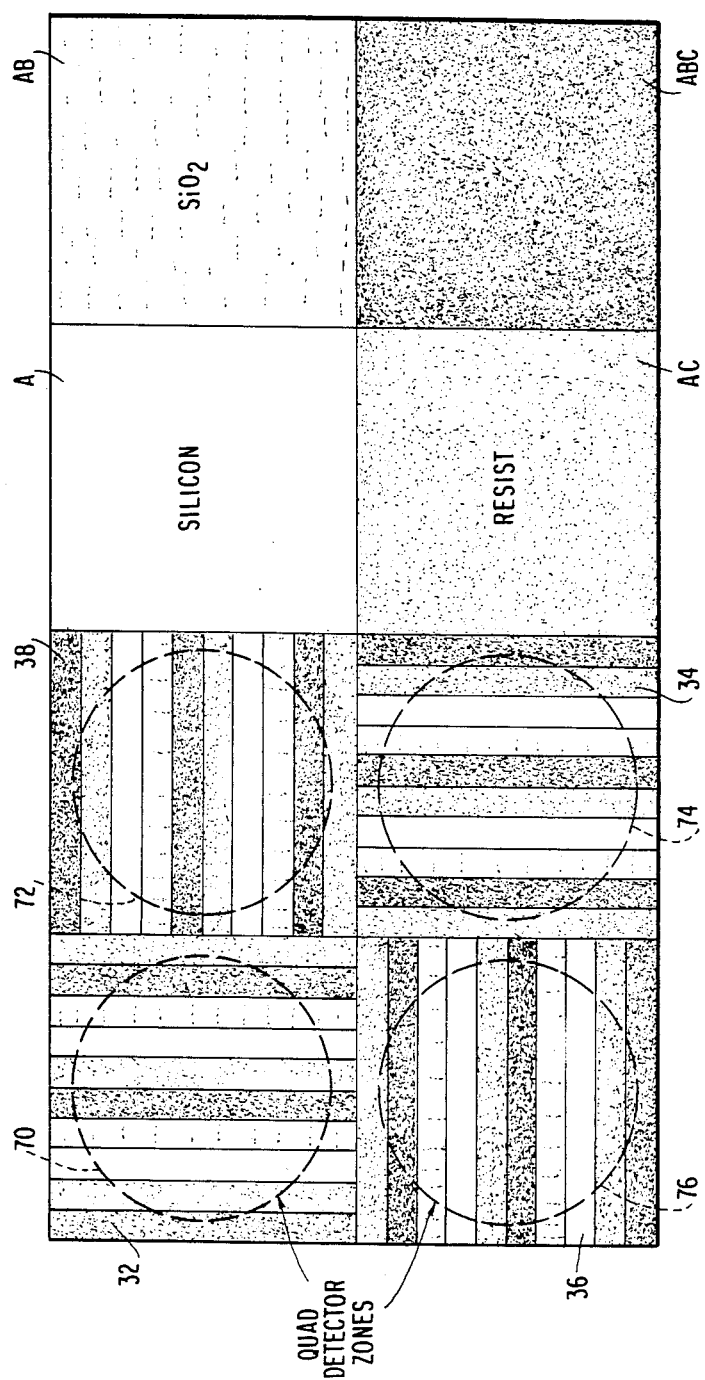
FIG. 6 schematically illustrates the manner in which one measures the intensity of the light reflected from the four individual phase grid structures and from the four macro-zones.

For the practice of this invention, it is necessary to know the individual reflectivities $R_A$, $R_{ABC}$, etc. Since it is generally not practical to assume or calculate the values of these individual reflectivities, in accordance with this invention they are determined by actual measurements in four macro-zones 60, 62, 64 and 66 as illustrated in FIG. 5, which shows a complete test pattern including the four macro-zones. First, the individual reflectivities of the four macro-zones are measured. This measurement can be accomplished in a single step by using a light detector divided into four zones 70, 72, 74 and 76, each of which is appropriately positioned for measuring the intensity I of the light reflected from a different one of the macro-zones. Next, the reflectivities of the four quadrants of the target pattern are individually determined in a similar manner with each of the four detector zones examining a different one of the phase-grid structures. More specifically, denoting the horizontal phase grids 32 and 34 by the subscript h, and using only numeric subscripts for the four macro-zones, the horizontal overlay error can be found from the formula $$\Delta_h = \frac{X(I_{h1} - I_{h2})}{2[I_1 + I_2 - (I_3 + I_4)]} \quad (3)$$

where X is the periodicity of the line/space pattern in nanometers, for example; I is the reflected light intensity in watts per square centimeter, for example; and $\Delta_h$ is the horizontal mis-registration in nanometers. The corresponding equation can be written for the vertical overlay error or mis-registration. (The average reflectivity R in the two earlier equations is actually a ratio of reflected energy and incident energy.) Since one half of the period multiplied by the length of a line equals the area of the line, X/2 in the above equation can be replaced by line area/line length; thus, the periodicity need not be known.

As shown by the above equations for $R_1$ and $R_2$, the offset or differential spacing of the two test patterns relative to each other for perfect registration produces a doubling effect in positional difference where the two test patterns are offset or mis-registered, thus doubling the detected reflection signals corresponding to the four respective regions. Furthermore, the phase-grid test pattern of this invention is self-calibrating: Variations in the reflectivities of the individual regions, due to processing or other factors, are automatically accounted for in the results. Furthermore, it can be shown that the registration measurement is insensitive to pattern linewidths, sidewall slopes, and other factors which reduce the effectiveness of prior art means of overlay measurement. Of course, measuring overlay error by the phase-grid method of this invention clearly applies to measurement of overlay between resist images and underlying resist or etched images. Furthermore, this method can also be applied to mask images over resist or etched images, thereby making it useful in such applications as mask-wafer alignment and mask characterization.

Since the materials forming the four regions are both light-transmissive and light-reflective, it is clear that light transmissivities could be used in the above equations with the corresponding constraint, in which case one would measure the corresponding transmitted light intensities rather than reflected light intensities.

Figure 7:
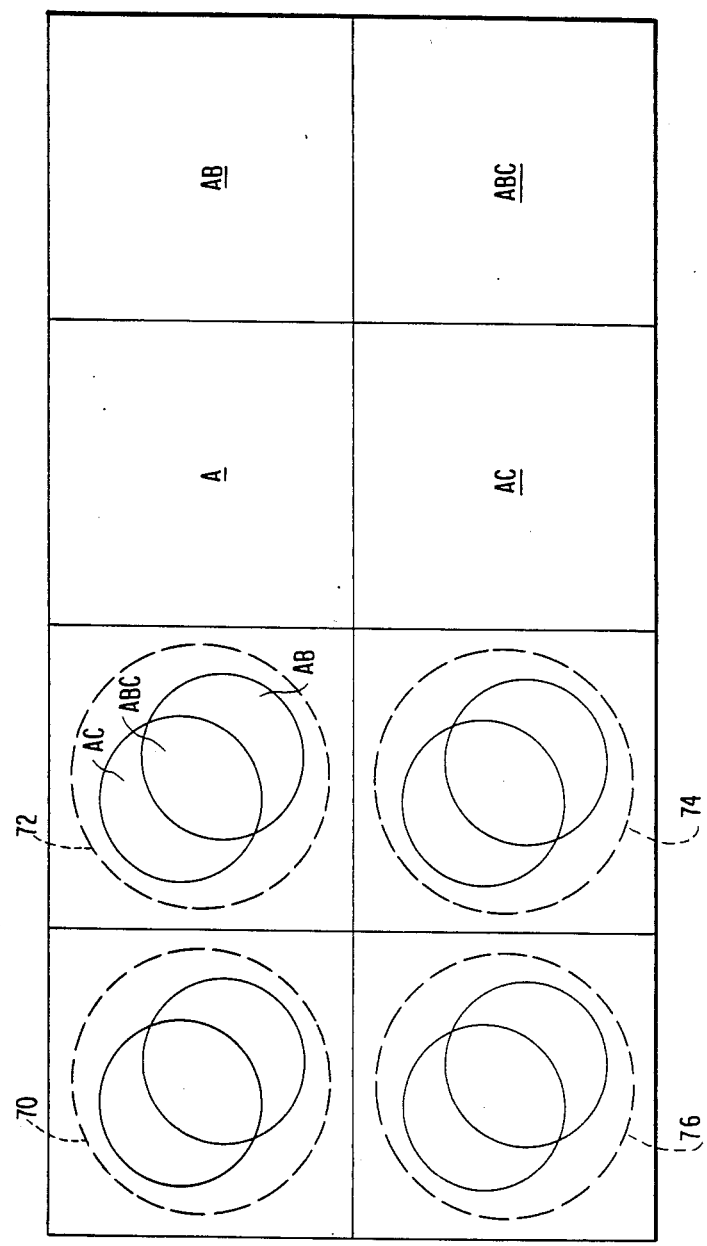
FIG. 7 illustrates circular patterns used in another embodiment of the invention.

Instead of lines or stripes, the patterns can be formed of areas of almost any geometrical configuration. For example, FIG. 7 illustrates the use of patterns in the form of circular areas which, when overlaid upon each other on a substrate A, form the four radiation-reflecting or radiation-transmitting regions A, AB, AC and ABC. In equation (3), one would merely replace X/2 with circle area/circle diameter. In other words, the configuration of each pattern is quite irrelevant so long as the four regions are formed.

The size of the macro-zones is not critical so long as they are larger than the aperture of the photodetector, which aperture must be larger than the composite pattern whose average reflected or transmitted light intensity is to be measured. In other words, for the circle example, these circles are individually quite small, and each, by definition, would have to be smaller than the aperture of the photodetector.

The circles could be squares or any other configuration. If the diameters of the circles, for example, are not the same, then their areas must be known, and this knowledge is obtained by making the corresponding macro-zones exactly equal to the two circles, respectively (in which case, of course, the photodetector aperture would automatically be larger than either of the two circles).

While in the preferred embodiment described above, four grid areas are used, in the ideal case only one x grid and one y grid are required:

$$I_r = I_o \cdot (r_1 f_1 + r_2 f_2 + r_3 f_3 + r_4 f_4) \qquad (4)$$

where
$I_r$ = the intensity of the reflected intensity,
$I_o$ = the intensity of the incident radiation,
$r_i$ = reflectivity of the structure i, and
$f_i$ = fraction of the sample area consisting of material i.
The problem is that $f_i$ may not be known (for example, there may be resist lines of different line/space ratios), that slopes consume a certain fraction of the total, and that similar non-ideal occurrences may exist.

With two horizontal grids, however, these non-ideal circumstances are almost totally canceled out (as seen in equation 3), and the same holds true for two vertical grids. The result is that measurement data is free from "noise" due to such effects to a much greater extent than such alternate methods as:

| Method | Data Noise |
|---|---|
| PG | 100 nm |
| Vidicon-based | 175 nm |
| Verniers | 125–250 nm (operator dependent) |

In order to get these advantages, the pair of horizontal test sites must be left-to-right mirror images, and, similarly, there must be vertical mirror symmetry on two vertical test sites.

For images of arbitrary shape in either the horizontal or vertical direction:

$$\Delta I_r = I_o \Sigma \, r_i \Delta f_i = I_o \Sigma \, r_i \Delta \frac{A_i}{A_t} = I_o \Sigma \, r_i \frac{1\Delta}{A_t} A_i$$

where $\Delta A_i$ is the change in area i due to a displacement of the upper image with respect to the lower image.

For completely arbitrary shapes, one needs to calculate $\Delta A_i$ as a function of horizontal displacement. For a shape which is arbitrary, but identical for all four structures involved, one needs to do this calculation only once. The simplest case involves the case of rectangular areas, as in the phase grids described above, where $\Delta A_i = \pm x = $ linear displacement = same for all four structures.

For a given set of materials, thicknesses, etc., the measurement effectiveness will depend on the illumination used. Broad-band illumination is preferred in order to accommodate as many different materials/structures as possible without requiring fine tuning and customization on a case-by-case basis. Infrared is most useful for materials like polysilicon, where visible or below would be strongly absorbed (i.e., the material would be opaque to the radiation).

Another piece of information that comes from the macrozones is a "resolution" figure which identifies the sensitivity of the method for given structure and illumination conditions.

Figure 8:
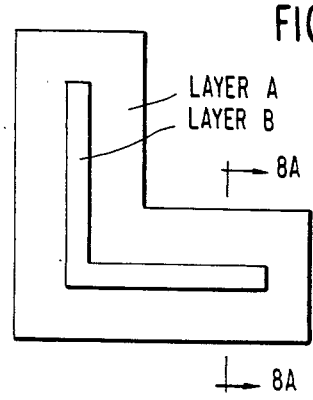
FIGS. 8-10 illustrate a vidicon-based method of overlay measurement.
Figure 8A:
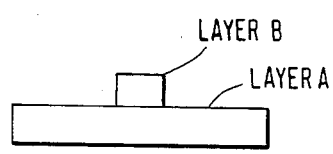
Figure 9:
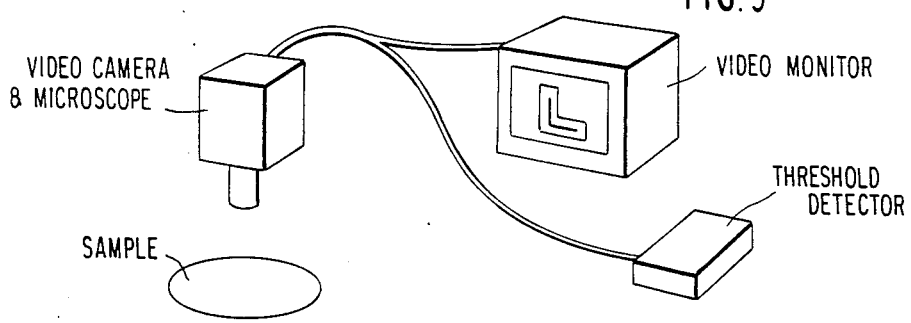
Figure 10:
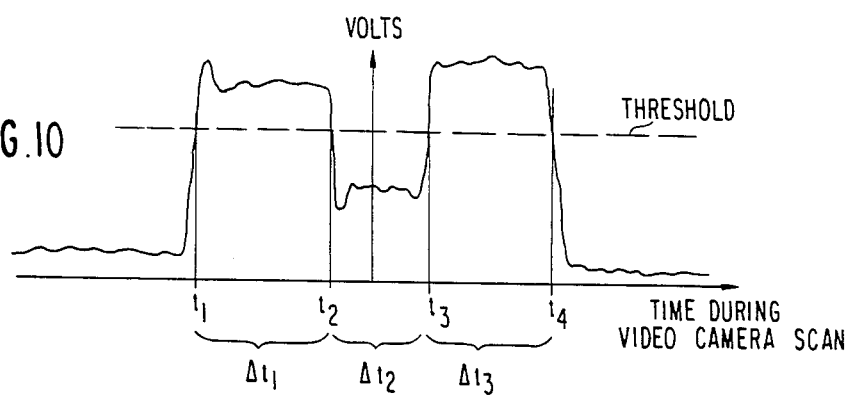
Figure 10A:
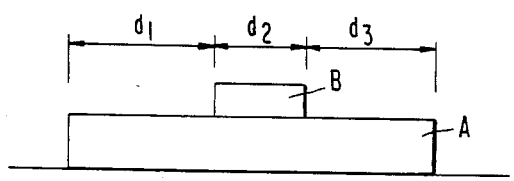

FIGS. 8A, 8B, 9, 10A and 10B illustrate the overlay measurement using a vidicon-based measurement tool. FIGS. 8A and 8B illustrate a test structure wherein the layer B is superinposed on the layer A. FIG. 9 is a schematic diagram illustrating the measuring system wherein a video camera and microscope unit scan a sample and provide corresponding electrical signal inputs to a video monitor and to a threshold detector. FIGS. 10A and 10B show the relationship between the voltage waveform of the threshold detector and the relevant distances on the test structure.

The values $\Delta t_1$, $\Delta t_2$, $\Delta t_3$ are supposed to be proportional to $d_1$, $d_2$, $d_3$; thus, one can deduce appropriate values for $d_1$, $d_2$, $d_3$ from the voltage waveform timing.

Ideally, image B is centered on image A, in which case $d_1 = d_3$ (i.e. $\Delta t_1 = \Delta t_3$) for a zero overlay error. If $d_1$ is not equal to $d_3$, then B must not be centered; the degree of overlay errors is given by $(d_1 - d_3/2)$, with the sign indicating left or right shift of B with respect to A.

In practice, various idealities break down, and the set of data $$\frac{\{d_1 - d_3\}}{\{2\}}$$

is not equal to the set of true overlay values, and this condition is reflected in a noise figure:

$$\frac{\Sigma \, (M_i - A_i)^{\frac{1}{2}}}{n} = RMS \text{ deviation},$$

where
$M_i$ = measured value of $i^{th}$ location,
$A_i$ = actual value at $i^{th}$ location,
$n$ = number of sites measured.

FIGS. 11–13 illustrate the vernier method of overlay measurement where Pattern A represents fingers of a known periodicity as shown in FIG. 11, and Pattern B represents fingers of a different known periodicity where $p_2 > p_1$. FIG. 13 illustrates a combination of Patterns A and B.

The relative lateral or horizontal positions of Patterns A and B can be estimated by visually observing which fingers are aligned, and the same estimation can be done for relative positions on a separate target.

Using the above RMS noise formula, on can "sort" among various meansurement techniques to determine which have better noise performance. PG (phase grid) typically shows the lowest noise figure, usually around 100 nm or so. The vidicon-based method usually produces a noise around 150 nm. The vernier method is highly desirable, but usually is at least as noisy as the vidicon-based method. Of all optical methods tested, the PG method consistly has the lowest noise figure, meaning that PG data is "truer".

We claim:

1. A method of measuring the error in registration of two overlaid patterns on a substrate, comprising the steps of:

choosing the materials of the two patterns and of the substrate so that they both partially transmit and partially reflect incident electromagnetic radiation;

designating the material of the substrate as A, and the materials of the two patterns as B and C, respectively, wherein the two overlaid patterns and the substrate form a target pattern having four regions consisting of four material layers A, AB, AC and ABC, respectively:

forming on said substrate four reference zones, each consisting of a different one of said four material layers, respectively;

exposing both said target pattern and said reference zones to incident electromagnetic radiation;

measuring the intensity of the corresponding radiation reflected or transmitted by each of the four reference zones and by each of the four regions;

averaging the measured intensities for the four reference zones to obtain an average reference value; and comparing the measured intensity for each of the four regions with the average reference value to obtain a measurement of the mis-registration of each of the overlaid patterns.

2. A method as defined in claim 1, further comprising: simultaneously exposing said target pattern and said four reference zones to said radiation.

3. A method as defined in claim 2, further comprising the step of choosing said materials A, B and C such that neither the reflectivity nor the transmissivity of region A equals that of region ABC, and such that neither the reflectivity nor the transmissivity of region AB equals that of region AC.

4. A method as defined in claim 3, wherein said patterns comprise a plurality of lines.

5. A method as defined in claim 4, wherein said lines are parallel.

6. A method as defined in claim 3, wherein each pattern comprises a plurality of spaced horizontal parallel lines and a plurality of spaced vertical parallel lines, the line/space periodicity being the same for all of said lines.

7. A method as defined in claim 6, wherein each pattern is in the form of a grid with the horizontal lines in the first and third quadrants and the vertical lines in the second and fourth quadrants.

8. A method as defined in claim 3, wherein said patterns are circular areas.

9. A method as defined in claim 8, wherein said reference zones are circular areas.

10. A method as defined in claim 1, wherein each pattern consists of a grid of four quadrants, and further comprising individually measuring the intensities from the first and third quadrants and comparing them with the intensities from the four reference zones to obtain a measurement of the mis-registration in only one of the horizontal and vertical directions.

11. A method as defined in claim 10, further comprising individually measuring the intensities from the second and fourth quadrants and comparing them with the intensities from the four reference zones to obtain a measurement of the mis-registration in only the other of the horizontal and vertical directions.

12. A method as defined in claim 1 wherein the substrate is a silicon wafer, material B is silicon dioxide, and material C is a photoresist.

13. A method as defined in claim 1 wherein said electromagnetic radiation is incoherent light.

* * * * *